United States Patent [19]
Hawkins et al.

[11] Patent Number: 5,936,894
[45] Date of Patent: *Aug. 10, 1999

[54] DUAL LEVEL WORDLINE CLAMP FOR REDUCED MEMORY CELL CURRENT

[75] Inventors: Andrew L. Hawkins, Santa Clara, Calif.; Jeffery Scott Hunt, Ackerman, Miss.; Satish C. Saripella; Sanjay Sunder, both of Starkville, Miss.

[73] Assignee: Cypress Semiconductor Corp., San Jose, Calif.

[ * ] Notice: This patent is subject to a terminal disclaimer.

[21] Appl. No.: 09/094,786

[22] Filed: Jun. 15, 1998

Related U.S. Application Data

[63] Continuation of application No. 08/769,241, Dec. 18, 1996, Pat. No. 5,864,507.

[51] Int. Cl.$^6$ .................................................. G11C 16/04
[52] U.S. Cl. .............................. 365/189.06; 365/189.09; 365/189.11
[58] Field of Search ........................... 365/189.06, 225.7, 365/189.09, 230, 156, 230.06, 189.11

[56] References Cited

U.S. PATENT DOCUMENTS

| | | | |
|---|---|---|---|
| 4,074,237 | 2/1978 | Spampinato | 365/189.06 |
| 4,156,941 | 5/1979 | Homma et al. | 365/233 |
| 4,546,457 | 10/1985 | Nozaki et al. | 365/230 |
| 5,287,307 | 2/1994 | Fukuda et al. | 365/189.06 |
| 5,333,122 | 7/1994 | Ninomiya | 365/189.11 |
| 5,796,651 | 8/1998 | Horne et al. | 365/156 |

*Primary Examiner*—David Nelms
*Assistant Examiner*—David Lam
*Attorney, Agent, or Firm*—Christopher P. Maiorana, P.C.

[57] ABSTRACT

The present invention concerns a method and apparatus for providing a dual level wordline clamp for use in a memory array. During a write operation, the clamp is at a level that ensures that a proper write margin is maintained. During a read operation, the clamp produces a lower level that reduces the overall current consumption of the circuit. During a write operation, the clamp also reduces the overall current consumption of the circuit. The present invention does not require complex reference circuits and, as a result, presents a minimal impact on die size.

20 Claims, 2 Drawing Sheets

DUAL LEVEL WORDLINE CLAMP FOR REDUCED MEMORY CELL CURRENT

This is a continuation of U.S. patent application Ser. No. 08/769,241, U.S. Pat. No. 5,864,507, filed Dec. 18, 1996.

FIELD OF THE INVENTION

The present invention relates to wordlines generally and, more particularly, to a dual level wordline clamp for reduced memory cell current during read and write operations.

BACKGROUND OF THE INVENTION

Wordline clamps may reduce memory cell currents. FIG. 1 illustrates a circuit 10 implementing a conventional wordline clamp in a programmable logic device (PLD). The circuit 10 contains a transistor 12, a transistor 14, a transistor 16, a transistor 18 and a transistor 20. The transistor 12 has a source that receives an input signal IO and a gate that receives a select signal SEL0. The drain of the transistor 12 is coupled to the gates of the transistors 14 and 16. Transistors 14 and 16 form a conventional inverting buffer. A signal ENABLE is presented to the gate of the transistor 18. The source of the transistor 14 is connected to a power supply voltage. The source of the transistor 14 and the drain of the transistor 16 are coupled together and the corresponding node between them is coupled to the source of the transistor 20. The source of the transistor 16 is coupled to the drain of the transistor 18. The source of the transistor 18 is coupled to ground. The drain of the transistor 20 presents an output signal ITB. The gate of the transistor 20 receives a reference voltage ITREF.

The input signal I0 is modulated at the output ITB by a reference voltage signal ITREF connected to the gate of the transistor 20. The transistor 20 is generally a high voltage NMOS pass gate. The output ITB can only rise to a threshold voltage below the gate voltage of the transistor 20. The gate voltage is generated by a complex reference circuit which acts to optimize operation(s) over process, temperature and voltage variations. However, the reference circuit adds complexity to the circuit. It is thus generally desirable to provide a relatively simple circuit, such as a voltage clamp, to control the output of a wordline in a memory circuit, and particularly a static random access memory (SRAM) circuit.

SUMMARY OF THE INVENTION

The present invention concerns a method and apparatus for providing a dual level wordline clamp for use in a memory array. During a write operation, the clamp is at a voltage and/or current level that ensures that a proper write margin is maintained. During a read operation, the clamp produces a lower voltage and/or current level that reduces the overall current consumption of the circuit. The clamp may also reduce the overall current consumption of the circuit during a write operation. The present invention does not require complex reference circuits and, as a result, presents a minimal impact on circuit layout and circuit complexity.

The objects, features and advantages of the present invention include providing dual level wordline clamp for reducing current consumption during read and write operations while providing an adequate write margin, eliminating any need for a reference circuit and reducing the overall current consumption of the circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
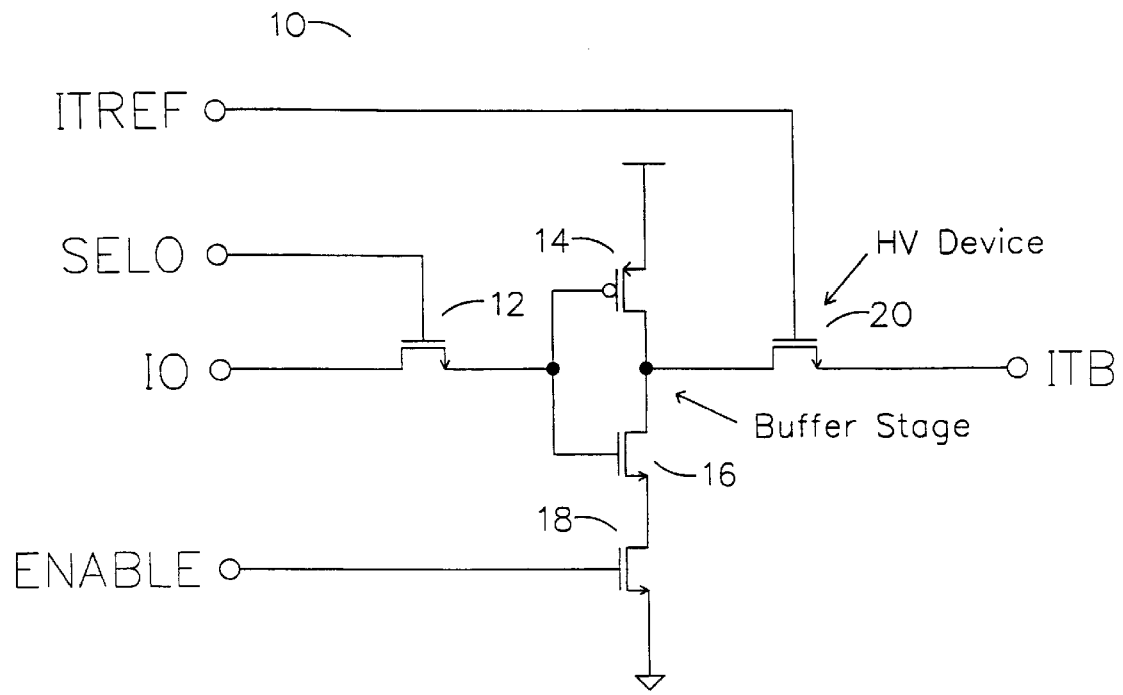
FIG. 1 is a circuit diagram of a previous approach clamp circuit implemented in a programmable logic device.
Figure 2:
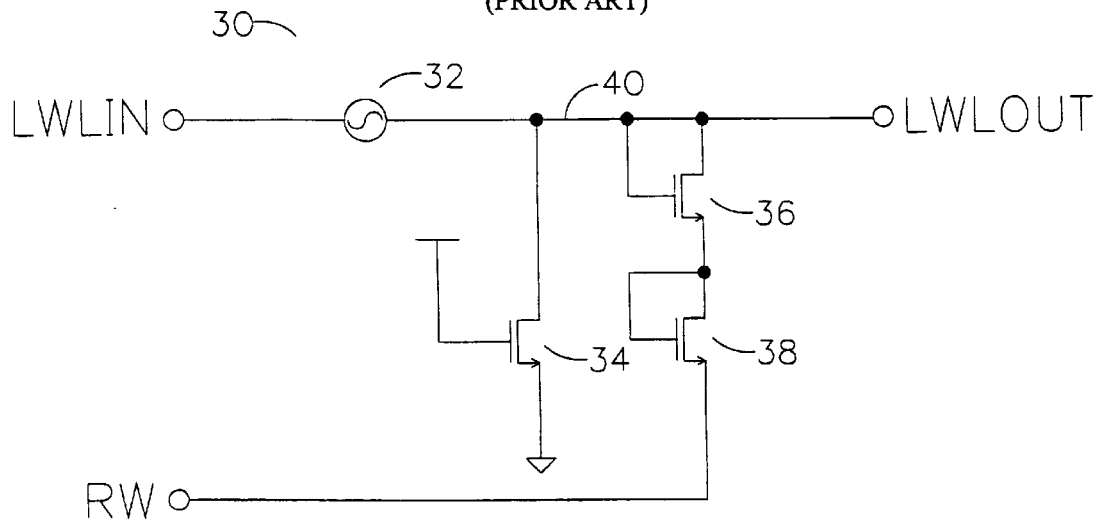
FIG. 2 is a circuit diagram of a preferred embodiment of the present invention.

Referring to FIG. 2, a diagram of a circuit 30 is shown in accordance with a preferred embodiment of the present invention. The circuit 30 generally comprises a transistor 34, a transistor 36, a transistor 38 and a wordline 40. A fuse 32 may be implemented in certain design applications. The fuse 32 generally receives an input signal LWLIN and is coupled to an output signal LWLOUT. The fuse 32 is also generally coupled to the drain of the transistor 34 as well as to the drain and gate of the transistor 36. The source of the transistor 36 is generally coupled to the drain and gate of the transistor 38. The source of the transistor 38 generally receives a read/write select signal RW. The source of the transistor 34 is generally coupled to ground. The gate of the transistor 34 is generally coupled to a power supply voltage (e.g., such as VCC). Since the drain and gate of the transistors 36 and 38 are generally coupled together, they each provide the general function of a diode. Naturally, one diode/transistor or three or more diodes/transistors could be implemented in place of the transistors 36 and 38, but two diodes are preferred. The transistor 34 generally functions as a pulldown clamp.

During a read operation, the input signal LWLIN generally transitions high and the select signal RW generally transitions low. The pulldown transistor 34 and the transistors 36 and 38 are generally on and pull the wordline 40 to a voltage below the power supply voltage VCC. The reduced voltage on the wordline generally reduces the gate drive on the pass gate in the memory cell (for example, the transistors 60 and 66 in FIG. 3). As a result, an overall reduction in current consumption is realized. The lower voltage on the wordline 40 may also improve the ability of circuit 30 to be more immune to read disturb issues.

During a write operation, the select signal RW generally transitions high and disables the transistors 36 and 38. As a result, only the transistor 34 is on, which generally provides a weak pulldown on the wordline 40. The wordline 40 is generally clamped to a voltage below the power supply voltage VCC but higher than the voltage level realized during the read operation. As a result, the circuit 30 allows for reduced current consumption when writing to a memory cell, but still ensures an adequate write margin. A balance between a reduced current for power consumption purposes and an adequate speed may be implemented to meet the design criteria of a particular application.

In the case of a defective wordline 40, the fuse 32 may be disabled (e.g., blown), by application of an over voltage effective for disabling the fuse and the transistor 34 pulls the wordline 40 to a low level (e.g., a ground level VSS). This generally decouples the wordline 40 from external circuits (not shown). As a result of the function(s) of the transistor 34 and at least one diode 36 and/or 38, the circuit 30 acts as a dual level wordline clamp where the level of the wordline depends on the mode of operation generally determined by the select signal RW. The select signal RW generally provides an indication of whether the circuit 30 is in a read or write mode. However, functions and/or operations other than reading and writing may be correlated to the select signal, for example, programming (program mode, where "LWLIN" carries a voltage generally greater than VCC), erasing (erase mode), testing (test mode), reducing overall chip current and/or power consumption ("power-down" mode), etc., to effect reduced current consumption in memory cells coupled to the input signal line generally having an active "high" voltage level (e.g., VCC).

The circuit 30 generally reduces the overall current consumed by the active columns in an array without the implementation of additional row decoder circuitry. Traditionally, additional row decoders may be used to segment the array to reduce the number of columns which reduces the overall current consumption of the device, but at the cost of an increased overall die size. Specifically, the implementation of additional row decoders may increase the overall size of the circuit, which is generally undesirable in high production processes.

Figure 3:
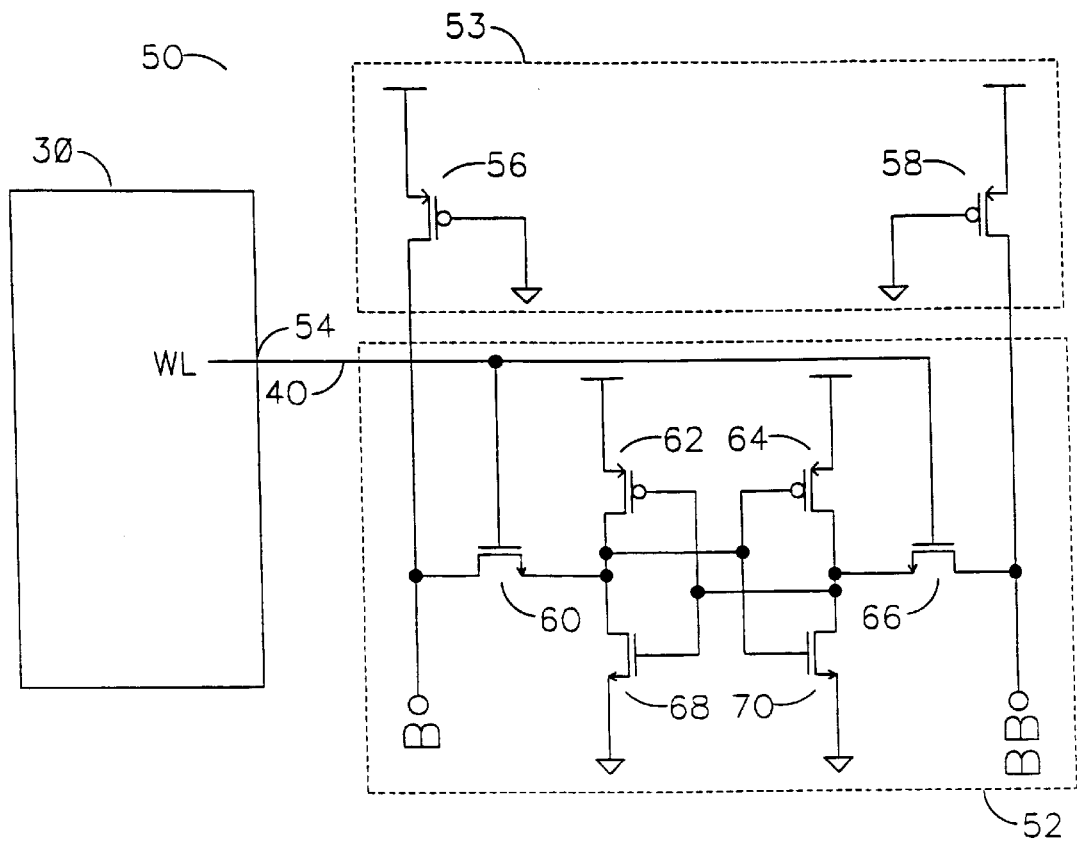
FIG. 3 is a diagram illustrating the implementation of the present invention in conjunction with a memory cell.

Referring to FIG. 3, a circuit 50 is shown comprising the clamp circuit 30, a memory cell 52 and bitline load circuit block 53. The clamp circuit 30 provides an output 54 that generally connects to the wordline 40. The bitline load circuit block 53 generally comprises a transistor 56 and a transistor 58 or other means for acting as bitline pull-ups. The memory cell 52 generally comprises one cell of a memory, such as in a static random access memory (SRAM), dynamic random access memory (DRAM), non-volatile memory (ROM, EPROM, EEPROM and flash memory), etc. See "Memory 1996", published by Integrated Circuit Engineering, Scottsdale, Ariz. (1996), pp. 7~10 through 7~19, 8~1 through 8~17, 9~1 through 9~14 and 10~1 through 10~10, the relevant portions of which are incorporated herein by reference.

In general, a memory cell comprises a pass transistor coupling a bitline to a capacitive device (e.g., a capacitor or node isolated between two or more transistors), controlled by a wordline. However, as shown in FIG. 3, the SRAM cell 52 generally comprises a transistor 60, a transistor 62, a transistor 64, a transistor 66, a transistor 68 and a transistor 70. The wordline 40 is generally coupled to the gates of transistors 60 and 66. The drains of the bitline load transistors 56 and 58 generally comprise loads on the bitline B and the bitline bar (or bitline complement) BB. The bitlines B and BB generally control reading from and writing to the memory cell 52. When both of the bitlines B and BB are high, no data is read or written. When one of the bitlines B or BB is low, a particular value is read or written to the memory cell 52. The transistors 62, 64, 68 and 70 are generally coupled between the transistors 60 and 66 to comprise the storage portion of the cell 52.

Figure 4:
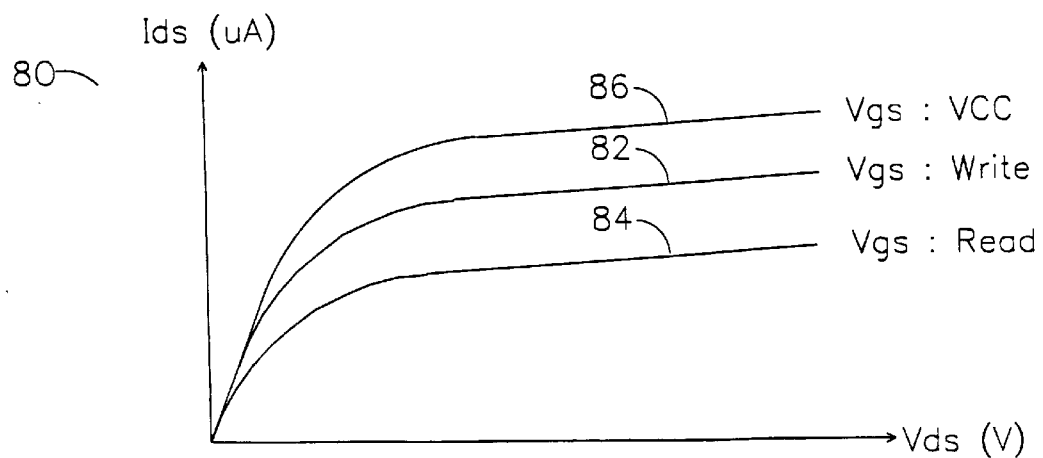
FIG. 4 is a plot illustrating the current savings realized by the present invention between the different levels for the read and write operations.

Referring to FIG. 4, a plot 80 is shown illustrating the current savings between the dual levels of the circuit 30. The X axis, which is generally labeled as Vds, generally represents the voltage between the drain and source on either the transistor 60 or the transistor 66, depending on the particular data that is written to the cell 52. The Y axis, which is generally labeled as Ids, represents the current consumed through the transistor 60 or the transistor 66 depending on the state of the data contained in the cell 52. A trace 82 generally represents a wordline level which corresponds to a write operation. A trace 84 generally corresponds to the wordline level for the read operation. A trace 86 generally corresponds to the wordline level equal to the power supply voltage VCC. As a result, when the circuit 30 is in read mode, a lower overall current consumption is realized while improving immunity to read disturb issues. When the circuit 30 is implemented in conjunction with a large memory array block, the current savings between the trace 86 and the trace 84 may become significant. In one implementation, the circuit 30 may realize a current savings in the range of 10~20 mA for a typical process corner. However, the precise amount of current savings may vary according to the design criteria of a particular application.

In general, since clamping the wordline reduces the gate voltage on the pass transistors of memory cells, the gate to source voltage of the pass transistor is generally reduced, thus reducing the current consumed in any given read or write operation. The current reduction is realized without requiring the bitline levels to drop, which may possibly cause read disturb problems and/or impact the overall speed of the circuits on the chip. The circuit 30 realizes the current savings without requiring a reference circuit for controlling the level of the wordline 40.

While the invention has been particularly shown and described with reference to the preferred embodiments thereof, it will be understood by those skilled in the art that various changes in form and details may be made without departing from the spirit and scope of the invention.

We claim:

1. A circuit comprising:
    a wordline; and
    a clamp circuit configured to generate a first voltage on said wordline during a read operation and a second voltage on said wordline during a write operation, wherein said first and second voltages are different voltages each generated in response to a select signal.
2. The circuit of claim 1, whererin said first and second voltages are less than a supply voltage.
3. The circuit according to claim 2, wherein said select signal is coupled to one or more devices coupled to said wordline.
4. The circuit according to claim 3 wherein:
    a first state of said select signal corresponds to said read operation; and
    a second state of select signal corresponds to said write operation.
5. The circuit according to claim 1 wherein said clamp circuit comprises one or more transistors.
6. The circuit of claim 5 wherein said one or more transistors couple said wordline to a ground voltage.
7. The circuit according to claim 1 wherein said clamp circuit comprises one or more diodes.
8. The circuit according to claim 1 wherein said clamp circuit comprises dual level wordline clamp.
9. The circuit according to claim 1 further comprising a memory cell coupled to said wordline.
10. The circuit of claim 9, wherein said memory cell comprises a random access memory (RAM) cell.
11. The circuit according to claim 10 wherein said RAM cell comprises a Static Random Access Memory (SRAM) cell.
12. A circuit comprising:
    wordline means; and
    means for clamping a first voltage on said wordline means during a read operation and a second voltage on said wordline means during a write operation, wherein said first and second voltages are different voltages each generated in response to a selected signal.
13. The circuit according to claim 12 wherein said first and second voltages are less than a supply voltage.
14. The circuit according to claim 13 wherein said clamping means comprises one or more transistors.

15. The circuit according to claim 12 further comprising:

select means coupled to said wordline means, said select means corresponding to an operational mode of an external circuit.

16. The circuit according to claim 15 wherein:

a first state of said select means corresponds to said read operation; and a second state of said select means corresponds to said write operation.

17. The circuit according to claim 12 wherein said clamping means comprises one or more diodes.

18. The circuit according to claim 12 further comprising a Static Random Access Memory (SRAM) cell coupled to said wordline means.

19. A method for reducing current consumption in a memory comprising the steps of:

(a) clamping a first voltage to a wordline in a memory cell in said memory in response to a first state of a control signal; and (b) clamping a second voltage to said wordline in response to a second state of said control signal, wherein said first and second voltages are different voltages.

20. The method according to claim 19, wherein:

a first state of said select signal corresponds to said read operation; and a second state of said select signal corresponds to said write operation.

* * * * *